(12) United States Patent
Cherala et al.

(10) Patent No.: US 10,996,560 B2
(45) Date of Patent: May 4, 2021

(54) REAL-TIME CORRECTION OF TEMPLATE DEFORMATION IN NANOIMPRINT LITHOGRAPHY

(71) Applicant: Canon Kabushiki Kaisha, Tokyo (JP)

(72) Inventors: Anshuman Cherala, Austin, TX (US); Mario Johannes Meissl, Austin, TX (US); Byung-Jin Choi, Austin, TX (US)

(73) Assignee: CANON KABUSHIKI KAISHA, Tokyo (JP)

(*) Notice: Subject to any disclaimer, the term of this patent is extended or adjusted under 35 U.S.C. 154(b) by 771 days.

(21) Appl. No.: 15/665,027

(22) Filed: Jul. 31, 2017

(65) Prior Publication Data
US 2019/0033708 A1    Jan. 31, 2019

(51) Int. Cl.
| | | |
|---|---|---|
| *G03F 7/00* | (2006.01) | |
| *G03F 9/00* | (2006.01) | |
| *G03F 1/36* | (2012.01) | |
| *G03F 1/60* | (2012.01) | |
| *G03F 1/68* | (2012.01) | |

(52) U.S. Cl.
CPC ............. *G03F 7/0002* (2013.01); *G03F 1/36* (2013.01); *G03F 9/7042* (2013.01); *G03F 9/7073* (2013.01); *G03F 1/60* (2013.01); *G03F 1/68* (2013.01); *G03F 9/7003* (2013.01); *G03F 9/7088* (2013.01)

(58) Field of Classification Search
CPC ........ G03F 7/0002; G03F 1/36; G03F 9/7042; G03F 9/7073; G03F 9/7088; G03F 9/7003; G03F 1/0092; G03F 1/60
See application file for complete search history.

(56) References Cited

U.S. PATENT DOCUMENTS

| | | |
|---|---|---|
| 6,873,087 B1 | 3/2005 | Choi et al. |
| 6,916,585 B2 | 7/2005 | Sreenivasan et al. |
| 6,932,934 B2 | 8/2005 | Choi et al. |
| 7,157,036 B2 | 1/2007 | Choi et al. |

(Continued)

FOREIGN PATENT DOCUMENTS

JP    2014049658 A    3/2014

*Primary Examiner* — Michael M. Robinson
(74) *Attorney, Agent, or Firm* — Canon U.S.A., Inc. IP Division

(57) ABSTRACT

Reducing an alignment error of an imprint lithography template with respect to a substrate includes locating central alignment marks of the template with respect to corresponding central alignment marks of the substrate and locating peripheral alignment marks of the template with respect to corresponding peripheral alignment marks of the substrate. In-plane alignment error of the template is assessed based on relative positions of central alignment marks of the template and corresponding central alignment marks of the substrate. A combined alignment error of the template is assessed based on relative positions of peripheral alignment marks of the template and corresponding peripheral alignment marks of the substrate. Out-of-plane alignment error of the template is assessed based on a difference between the-combined and the in-plane alignment error of the template, and a relative position of the template and the substrate is adjusted to reduce the out-of-plane alignment error of the template.

11 Claims, 10 Drawing Sheets

(56) References Cited

U.S. PATENT DOCUMENTS

| | | |
|---|---|---|
| 7,170,589 B2 | 1/2007 | Cherala et al. |
| 7,298,456 B2 | 11/2007 | Cherala et al. |
| 7,420,654 B2 | 9/2008 | Cherala et al. |
| 8,387,482 B2 | 3/2013 | Choi et al. |
| 2004/0124566 A1 | 7/2004 | Sreenivasan et al. |
| 2004/0188381 A1 | 9/2004 | Sreenivasan |
| 2004/0211754 A1 | 10/2004 | Sreenivasan |
| 2005/0187339 A1 | 8/2005 | Xu et al. |
| 2014/0061969 A1* | 3/2014 | Okamoto .............. G03F 7/0002 264/293 |
| 2019/0164770 A1* | 5/2019 | Takukuwa .......... H01L 21/3105 |

* cited by examiner

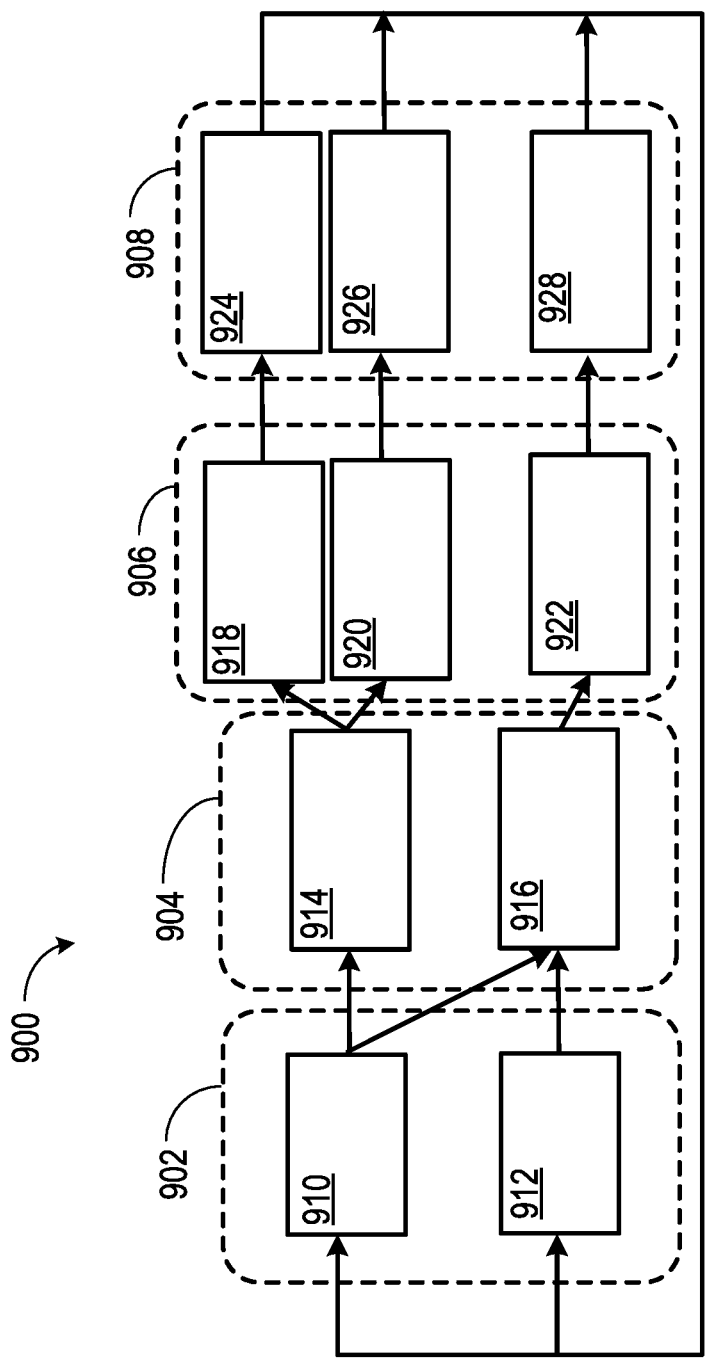

REAL-TIME CORRECTION OF TEMPLATE DEFORMATION IN NANOIMPRINT LITHOGRAPHY

TECHNICAL FIELD

This invention relates to real-time correction of template deformation in nanoimprint lithography.

BACKGROUND

During a nanoimprint lithography process, field corners on the substrate and corners of the imprint lithography template tend to deform due at least in part to the force exerted on the substrate by the template during imprinting. This out-of-plane deformation of the template can affect image placement and residual layer uniformity. With current alignment systems, it is difficult to distinguish between in-plane and out-of-plane alignment errors, and therefore difficult to implement appropriate correction.

SUMMARY

In a first general aspect, reducing an alignment error of an imprint lithography template with respect to a substrate includes disposing an imprint resist on the substrate and contacting the imprint resist with the template. The template includes peripheral alignment marks in a peripheral region of the template and central alignment marks in a central region of the template, and the substrate includes peripheral alignment marks that correspond to the peripheral alignment marks of the template and central alignment marks that correspond to the central alignment marks of the template. The first general aspect further includes locating each central alignment mark of the template with respect to each corresponding central alignment mark of the substrate, and locating each peripheral alignment mark of the template with respect to each corresponding peripheral alignment mark of the substrate. The first general aspect further includes assessing an in-plane alignment error of the template based on relative positions of each central alignment mark of the template and each corresponding central alignment mark of the substrate, and assessing a combined alignment error of the template based on relative positions of each peripheral alignment mark of the template and each corresponding peripheral alignment mark of the substrate. The combined alignment error of the template comprises the in-plane alignment error of the template and an out-of-plane alignment error of the template. The first general aspect further includes assessing the out-of-plane alignment error of the template based on a difference between the combined alignment error of the template and the in-plane alignment error of the template, and adjusting a relative position of the template and the substrate to reduce the out-of-plane alignment error of the template.

A second general aspect includes the first general aspect, followed by polymerizing the imprint resist to yield a polymeric layer in contact with the template, and separating the template from the polymeric layer to yield an article. The article may be a processed substrate or an optical component.

Implementations of the first and second general aspects may include one or more of the following features.

Adjusting the relative position of the template and the substrate to reduce the out-of-plane alignment error of the template may include adjusting relative positions of the peripheral alignment marks of the template and the corresponding peripheral alignment marks of the substrate. In particular, adjusting the relative positions of the peripheral alignment marks of the template and the corresponding peripheral alignment marks of the substrate may include at least one of tilting the template relative to the substrate and increasing or decreasing a distance between the template and the substrate, thereby increasing or decreasing a force exerted on the substrate by the template.

Adjusting the relative position of the template and the substrate to reduce the out-of-plane alignment error of the template may include comparing a magnification error of the central region of the template based on the central alignment marks of the template and the corresponding central alignment marks of the substrate with a magnification error of the peripheral region of the template based on the peripheral alignment marks of the template and the corresponding peripheral alignment marks of the substrate, and tilting the template relative to the substrate or increasing or decreasing a distance between the template and the substrate until the magnification error of the peripheral region of the template is substantially equal to the magnification error of the central region of the template. Adjusting the relative position of the template and the substrate to reduce the out-of-plane alignment error of the template may include tilting the template relative to the substrate to compensate for a tilting of the substrate about an axis in the plane of the substrate due at least in part to force applied to the substrate with the template.

In some implementations, after adjusting the relative position of the template and the substrate to reduce the out-of-plane alignment error of the template, the locating, assessing, and adjusting of the first general aspect are repeated at least one to further reduce or to minimize the out-of-plane alignment error of the template.

The central region of the template may be substantially free of out-of-plane alignment error. Some implementations include adjusting the relative position of the template and the substrate to reduce the in-plane alignment error of the template. Adjusting the relative position of the template and the substrate to reduce the in-plane alignment error of the template may include adjusting relative positions of the central alignment marks of the template and the corresponding central alignment marks of the substrate. Adjusting the relative positions of the central alignment marks of the template and the corresponding central alignment marks of the substrate may include at least one of: translating the template or the substrate in the plane of the template or the substrate, respectively; rotating the template or the substrate in the plane of the template or the substrate, respectively; and increasing or decreasing a compression force to opposite sides of the template.

In a third general aspect, an imprint lithography system for reducing an alignment error of an imprint lithography template with respect to a substrate includes a template chuck configured to retain a template, a substrate chuck configured to retain a substrate, an imprint head configured to adjust a position of the template chuck relative to a position of the substrate chuck, and a controller in communication with the imprint head. The controller is configured to: a) assess an in-plane alignment error of a template in contact with a substrate based on relative positions of corresponding central alignment marks in a central region of the template and on the substrate; b) assess a combined alignment error of the template based on relative positions of corresponding peripheral alignment marks in a peripheral region of the template and on the substrate, wherein the combined alignment error of the template comprises in-plane and out-of-plane alignment error of the template; c) assess a difference between the combined alignment error of the template and the in-plane alignment error of the template to yield the out-of-plane alignment error of the template; and d) provide a signal to the imprint head to adjust a position of a template in the template chuck relative to a position of a substrate in the substrate chuck to reduce the out-of-plane alignment error of the template.

Implementations of the third general aspect may include one or more of the following features.

The controller may be configured to provide the signal to the imprint head to translate the template. The controller may be configured to provide the signal to the imprint head to tilt the template about an axis in the plane of the template. The controller may be configured to provide the signal to the imprint head to increase or decrease a distance between the substrate and the template. The controller may be further configured to repeat a) through d) to minimize the out-of-plane alignment error of the template.

In some implementations, the system further includes a magnification actuator configured to adjust a compression force on sides of a template retained in the template chuck, and the controller is in communication with and further configured to provide a signal to the magnification actuator to reduce the in-plane alignment error of the template.

A fourth general aspect includes an imprint lithography template having central alignment marks on a surface of the template in a central region of the template, and peripheral alignment marks on the surface of the template in a peripheral region of the template. The central alignment marks define corners of a polygon, and each peripheral alignment mark is positioned proximate a corner of the template or a boundary of the template imprinting area.

Implementations of the fourth general aspect may include one or more of the following features.

The central alignment marks may define corners of a quadrilateral, such as a rectangle or parallelogram.

Advantages of the general aspects and implementations described herein include real-time feedback control of in-plane and out-of-plane alignment errors, resulting in rapid and accurate correction of alignment errors in imprint lithography. The rapid and accurate correction results in not only improved overlay, but also increased uniformity in the residual layer thickness of imprinted substrates.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF DRAWINGS

FIG. 9 depicts an alignment system for adjusting a relative position of a nanoimprint lithography template and substrate.

DETAILED DESCRIPTION

Figure 1:
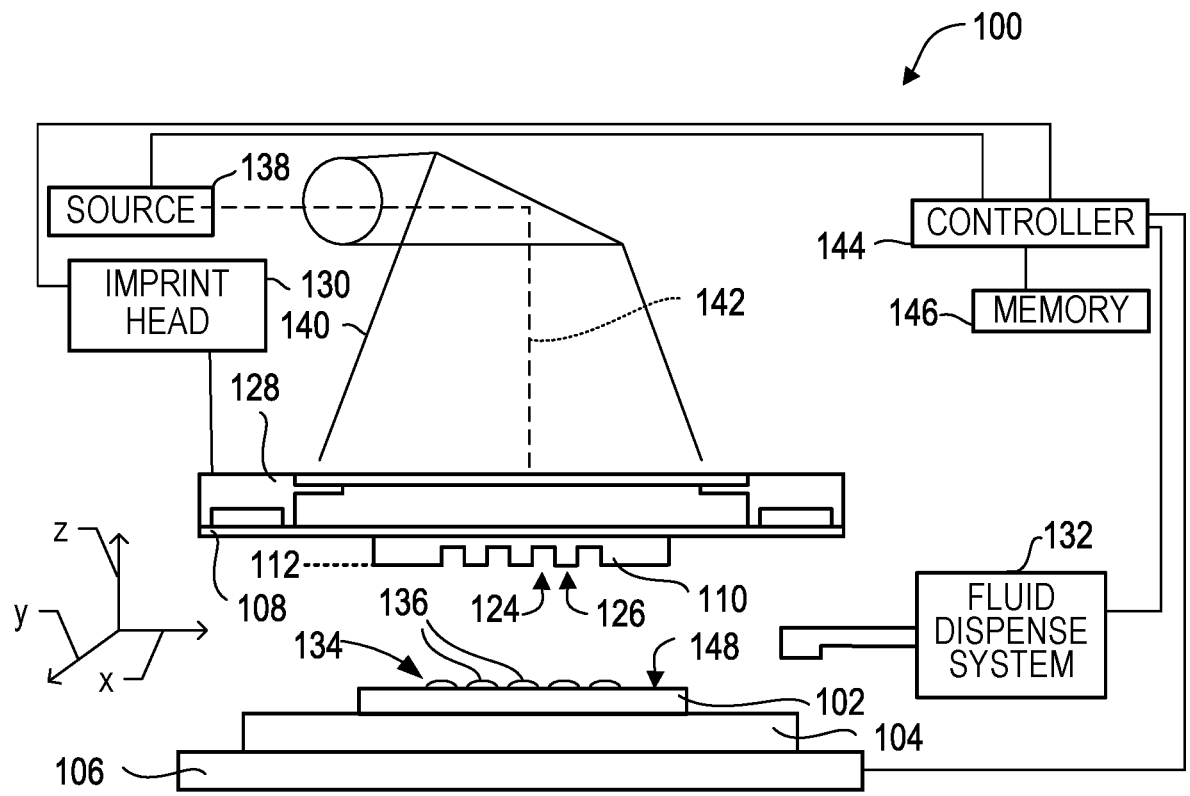
FIG. 1 depicts a side view of a nanoimprint lithography system.

FIG. 1 illustrates an imprint lithography system 100 that forms a relief pattern on a substrate 102. The substrate 102 may be coupled to a substrate chuck 104. In some examples, the substrate chuck 104 includes a vacuum chuck, a pin-type chuck, a groove-type chuck, an electromagnetic chuck, or other appropriate chuck. Exemplary chucks are described in U.S. Pat. No. 6,873,087, which is hereby incorporated by reference herein. The substrate 102 and the substrate chuck 104 may be further supported by a stage 106. The stage 106 provides motion about the x-, y-, and z-axes. The stage 106, the substrate 102, and the substrate chuck 104 may also be positioned on a base (not shown).

The imprint lithography system 100 includes an imprint lithography template 108 that is spaced apart from the substrate 102. In some examples, the template 108 includes a mesa 110 (mold 110) that extends from the template 108 toward the substrate 102. In some examples, the mold 110 includes a patterning surface 112. The template 108 and/or the mold 110 may be formed from such materials including, but not limited to, fused-silica, quartz, silicon, organic polymers, siloxane polymers, borosilicate glass, fluorocarbon polymers, metal, hardened sapphire, or other appropriate material. In the illustrated example, the patterning surface 122 includes a plurality of features defined by spaced-apart recesses 124 and protrusions 126. However, in some examples, other configurations of features are possible. The patterning surface 112 may define any pattern that forms the basis of a pattern to be formed on substrate 102.

The template 108 may be coupled to a template chuck 128. In some examples, the template chuck 128 includes a vacuum chuck, a pin-type chuck, a groove-type chuck, an electromagnetic chuck, or any appropriate chuck. Exemplary chucks are described in U.S. Pat. No. 6,873,087. Further, the template chuck 128 may be coupled to an imprint head 130 such that the template chuck 128, the imprint head 130, or both are configured to facilitate movement of the template 118. Movement of the template 118 includes movement in the plane of the template (in-plane movement) and movement out of the plane of the template (out-of-plane movement) with respect to the template. In-plane movement includes translation of the template 118 in the plane of the template (e.g., in the X-Y plane as depicted in FIG. 1) and rotation of the template in the plane of the template (e.g., in the X-Y plane and about the Z axis). Translation or rotation of the template 118 with respect to the substrate 102 may also be achieved by translation or rotation of the substrate. In-plane movement of the template 118 also includes increasing or decreasing a compression force on opposite sides of the template (e.g., with a magnification actuator) to increase or decrease dimensions of the template in the X-Y plane of the template. Out-of-plane movement of the template 118 includes translation of the template along the Z-axis (e.g., to increase or decrease a force applied to the substrate via the template by increasing or decreasing the distance between the template and the substrate) and rotation of the template about an axis in the X-Y plane of the template. Rotation of template 118 about an axis in the X-Y plane of the template changes an angle between the X-Y plane of the template 118 and the X-Y plane of substrate 102, and is referred herein to as "tilting" the template with respect to the substrate, or changing a "tilt" or "tilt angle" of the template with respect to the substrate. U.S. Pat. No. 8,387,482 discloses movement of a template via an imprint head in an imprint lithography system, and is incorporated by reference herein.

The imprint lithography system 100 may further include a fluid dispense system 132. The fluid dispense system 132 may be used to deposit a polymerizable material 134 on the substrate 102. The polymerizable material 134 may be disposed on the substrate 102 using techniques such as drop dispense, spin-coating, dip coating, chemical vapor deposition (CVD), physical vapor deposition (PVD), thin film deposition, thick film deposition, or other appropriate method. In some examples, the polymerizable material 134 is disposed on the substrate 102 before or after a desired volume is defined between the mold 110 and the substrate 102. The polymerizable material 134 may include monomers as described in U.S. Pat. No. 7,157,036 and U.S. Patent Application Publication No. 2005/0187339, both of which are incorporated by reference herein. In some examples, the polymerizable material 134 is disposed on the substrate 102 as a plurality of droplets 136.

Figure 2:
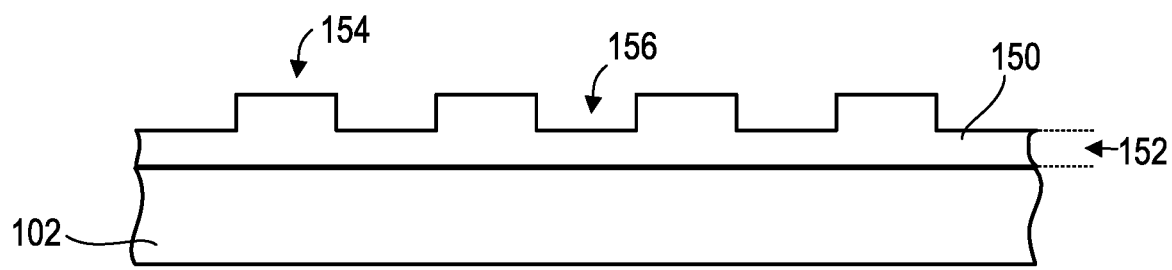
FIG. 2 depicts a side view of the substrate of FIG. 1.

Referring to FIGS. 1 and 2, the imprint lithography system 100 may further include an energy source 138 coupled to direct energy 140 along a path 142. In some examples, the imprint head 130 and the stage 106 are configured to position the template 108 and the substrate 102 in superimposition with the path 142. The imprint lithography system 110 may be regulated by a controller 144 in communication with the stage 106, the imprint head 130, the fluid dispense system 132, the energy source 138, or any combination thereof, and may operate on a computer readable program stored in a memory 146.

In some examples, the imprint head 130, the stage 106, or both, vary a distance between the mold 110 and the substrate 102 to define a desired volume therebetween that is filled by the polymerizable material 134. For example, the imprint head 130 may apply a force to the template 108 such that the mold 110 contacts the polymerizable material 134. After the desired volume is filled by the polymerizable material 134, the energy source 138 produces energy 140, such as broadband ultraviolet radiation, causing the polymerizable material 134 to polymerize and to conform to the shape of a surface 148 of the substrate 102 and the patterning surface 122, defining a polymeric patterned layer 150 on the substrate 102. In some examples, the patterned layer 150 includes a residual layer 152 and a plurality of features shown as protrusions 154 and recessions 156, with the protrusions 154 having a thickness $t_1$ and the residual layer 152 having a thickness $t_2$.

The above-described system and process may be further implemented in imprint lithography processes and systems referred to in U.S. Pat. No. 6,932,934, U.S. Patent Application Publication No. 2004/0124566, U.S. Patent Application Publication No. 2004/0188381, and U.S. Patent Application Publication No. 2004/0211754, all of which are incorporated by reference herein.

Imprint lithography substrates and templates may include corresponding pairs of alignment marks that allow real-time alignment of the template and the substrate. After the patterned template is positioned over the substrate (e.g., superimposed over the substrate), an alignment of the template alignment marks with respect to the substrate alignment marks is determined. Alignment schemes may include "through the mask" (TTM) measurement of alignment errors associated with pairs of corresponding alignment marks, followed by compensation of these errors to achieve accurate alignment of the template and a desired imprint location on the substrate as disclosed in U.S. Pat. Nos. 6,916,585; 7,170,589; 7,298,456; and 7,420,654, all of which are incorporated by reference herein. Alignment errors may be caused by relative positioning of the substrate and the template, deformation of the substrate or the template, or a combination thereof.

In-plane alignment error may be caused by placement error, rotation error, magnification error, skew error, template distortion error, or any combination thereof. Placement error generally refers to X-Y positioning errors between a template and substrate (that is, translation along the X axis, the Y axis, or both, where the X and Y axes are in the plane of or parallel to the imprinting surface of the template or the substrate, as depicted in FIG. 1). Rotation (or theta) error generally refers to the relative orientation error about the Z axis (that is, rotation about the Z axis, where the Z axis is orthogonal to the X-Y plane as depicted in FIG. 1). Magnification error generally refers to thermal, optical or material induced shrinkage or expansion of the imprinted area as compared to the original patterned area on the template. Skew error generally refers to a skewing of the template with respect to the substrate, such that sides of the template are not orthogonal. Template distortion error generally includes magnification of a first portion of a template relative to a second portion of a template, such that the template has a trapezoidal or higher order polygonal distortion with respect to the substrate.

Placement errors in which a template alignment mark and a corresponding substrate alignment mark are offset in the X-Y plane may be compensated for by relative movement of the template and the substrate (e.g., by controlled movement of the substrate, the template, or both in the X-Y plane). Rotation errors may be compensated for by altering the relative angle of the template and substrate in the X-Y plane (e.g., by rotation of the substrate, the template, or both). Magnification errors and template distortion errors may be compensated for by altering the physical dimensions of the template in the X-Y plane (e.g., by increasing or decreasing a compression force to opposite sides of the template).

Figure 3:
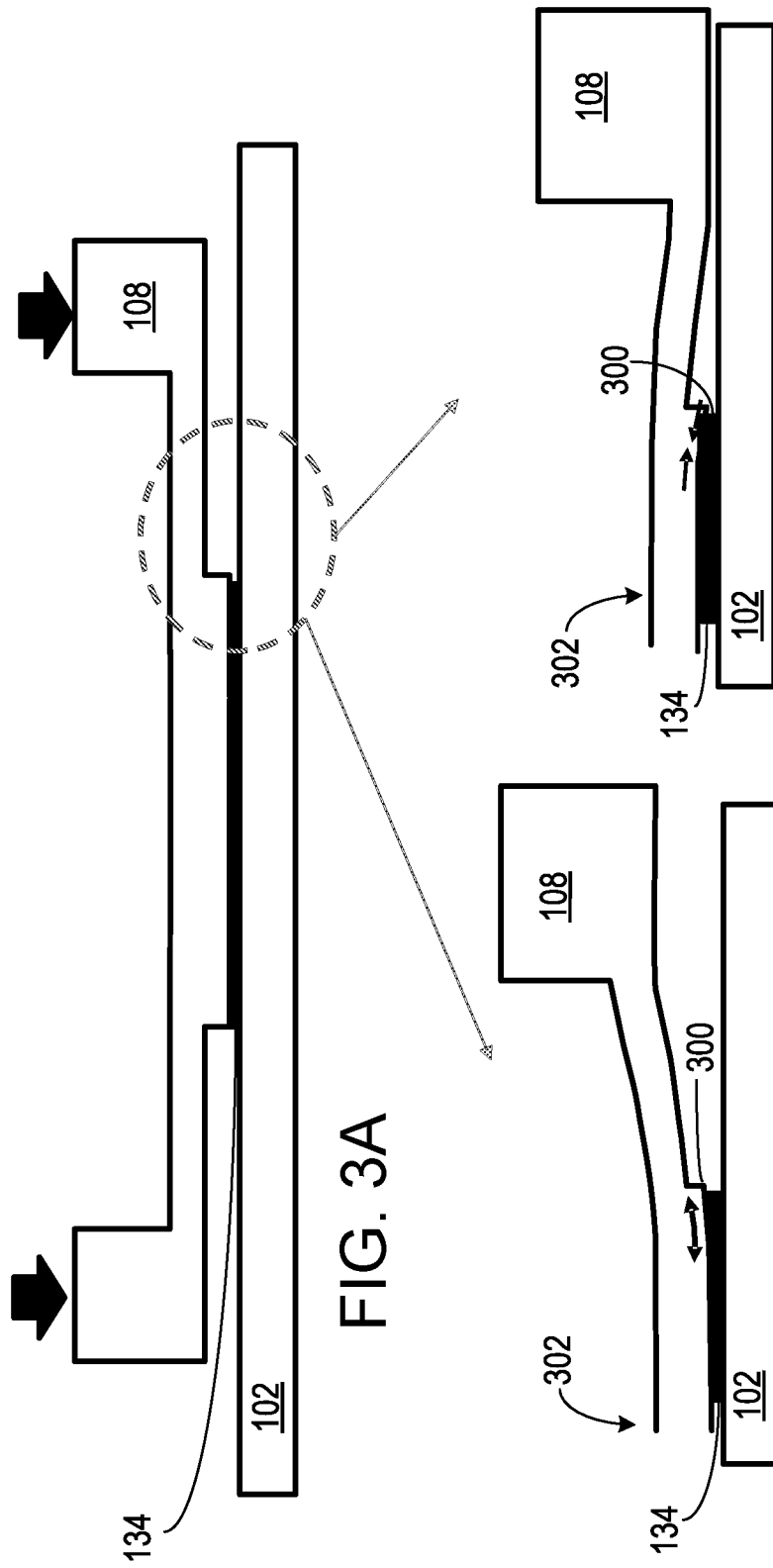
FIG. 3A depicts a side view of a nanoimprint lithography template in contact with a polymerizable material on a substrate.
FIGS. 3B and 3C depict out-of-plane deformation of a corner of the nanoimprint lithography template due to force exerted on the substrate by the template.

Out-of-plane alignment errors may be caused by force errors and "tilt" errors that are manifested as a result of bending of the template. Force errors may be understood with respect to FIGS. 3A-3C. FIG. 3A depicts template 108 in contact with polymerizable material 134 on substrate 102. The vertical arrows indicate a force on the template from the imprint head. When the force is too low on a corner 300 of the template 108, the template bends such that the distance between the surface of the template and the surface of the substrate 102 is greater than the distance at a central region 302 of the template, as depicted in FIG. 3B. When the force is too high on a corner 300 of the template 108, the template bends such that the distance between the surface of the template and the surface of the substrate 102 is less than the distance at a central region 302 of the template, as depicted in FIG. 3C.

For a 1.1 mm thick fused silica template with 64 mm D coreout, a 1 N imprint force typically causes alignment marks in a peripheral region (e.g., a corners) of the template to deform about 10 nm. Increasing or decreasing the force exerted on the substrate by the template may be accomplished by decreasing or increasing a distance between the substrate and the template, respectively, by movement of the template via the imprint head along the Z axis.

Figure 4:
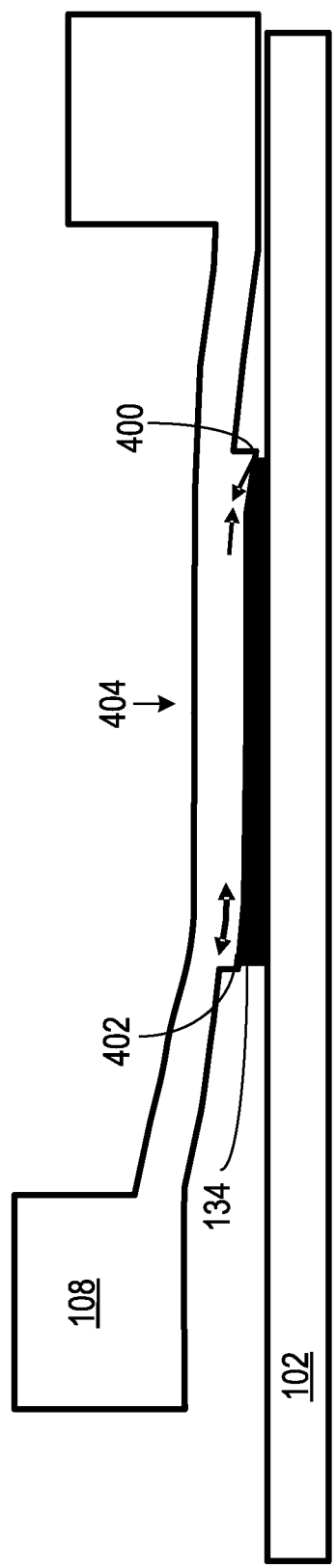
FIG. 4 depicts a side view of a nanoimprint lithography template in contact with a polymerizable material on a substrate, with out-of-plane deformation of the template due to a tilt of the template with respect to the substrate.

"Tilt" errors generally refer to bending of the template in a peripheral region (e.g., a corner) due at least in part to rotation of the template about an axis in the X-Y plane of the template. FIG. 4 depicts template 108 in contact with polymerizable material 134 on substrate 102, with the template rotated or "tilted" toward substrate 102 at corner 400. When template 108 is rotated (or "tilted") about an axis in the X-Y plane of the template, the template bends at corners 400 and 402. As depicted in FIG. 4, the distance between corner 400 and substrate 102 is less than the distance between the template 108 and the substrate 102 at a central region 404 of the template, and the distance between corner 402 and the substrate is greater than the distance between the template and the substrate at the central region.

Out-of-plane deformation, in particular out-of-plane deformations caused by force errors at corners of a template, when detected and analyzed by a "through the mask" (TTM) alignment system based on alignment marks in corners of the template, register as an apparent field magnification (i.e., in-plane deformation). In addition to degrading overlay, this deformation may also preclude the use of certain alignment marks for real-time adjustment of the magnification actuator, since apparent magnification due to force on the substrate by the template in the Z direction can be difficult to distinguish from in-plane magnification. In addition to imprint force, field tilt in X and Y directions can also affect overlay.

Alignment marks at different locations on an imprint field have different sensitivity to imprint force and air cavity pressure. Alignment marks in a peripheral region of a template and alignment marks in a central region of a template may be subject to in-plane alignment error of substantially the same magnitude. Alignment marks in a peripheral region of a template (e.g., in the corners of a template) may be subject to greater out-of-plane alignment error than alignment marks in a central region of a template. In some cases, alignment marks in a central region of the template are substantially free of out-of-plane alignment error. By grouping alignment marks into those subject to out-of-plane alignment error and those substantially free of out-of-plane alignment error, in-plane alignment error and its associated correction can be decoupled from out-of-plane alignment error and its associated correction in a real-time feedback process.

Figure 5:
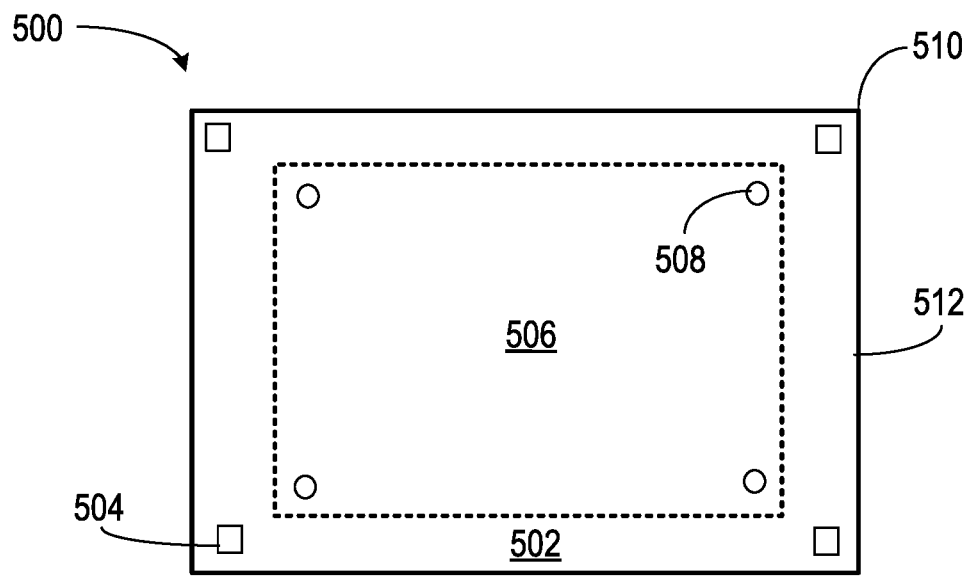
FIG. 5 depicts a top view of a nanoimprint lithography template having a central region and a peripheral region in the X-Y plane of the template.

FIG. 5 depicts nanoimprint lithography template 500 in the X-Y plane of the template. Template 500 has peripheral region 502 with peripheral alignment marks 504 and central region 506 with central alignment marks 508. In some examples, peripheral region 502 includes up to several centimeters (e.g., up to 2 cm or up to 4 cm) at a boundary of the imprinting portion of the template. Alignment marks typically include gratings, checker-board marks, or other appropriate indicia formed in a surface of the template, as described in U.S. Pat. No. 7,880,872, which is incorporated by reference herein. In some examples, alignment marks have a length or width of about 100 µm, about 50 µm, or less.

Central region 506 is typically subject to in-plane alignment error and is typically substantially free of out-of-plane alignment error or deformation in an imprinting process. Peripheral region 502 is typically subject to a combination of in-plane alignment error and out-of-plane alignment error or deformation in an imprinting process. As used herein, "combined deformation" generally refers to as a combination of in-plane alignment error and out-of-plane alignment error.

The number of peripheral alignment marks 504 in peripheral region 502 of template 500 is at least four. Peripheral alignment marks 504 may be proximate corners 510 or edges 512 of template 500. The number of central alignment marks 508 is at least four. In some embodiments, a number of peripheral alignment marks 504 or central alignment marks 508 is 8, 10, 12, 14, 16, 18, 20, or more. Central alignment marks 508 may define the corners of a polygon, such a quadrilateral (e.g., a rectangle or a parallelogram). However, other symmetrical or asymmetrical placements of central alignment marks may be implemented as appropriate.

Figure 6:
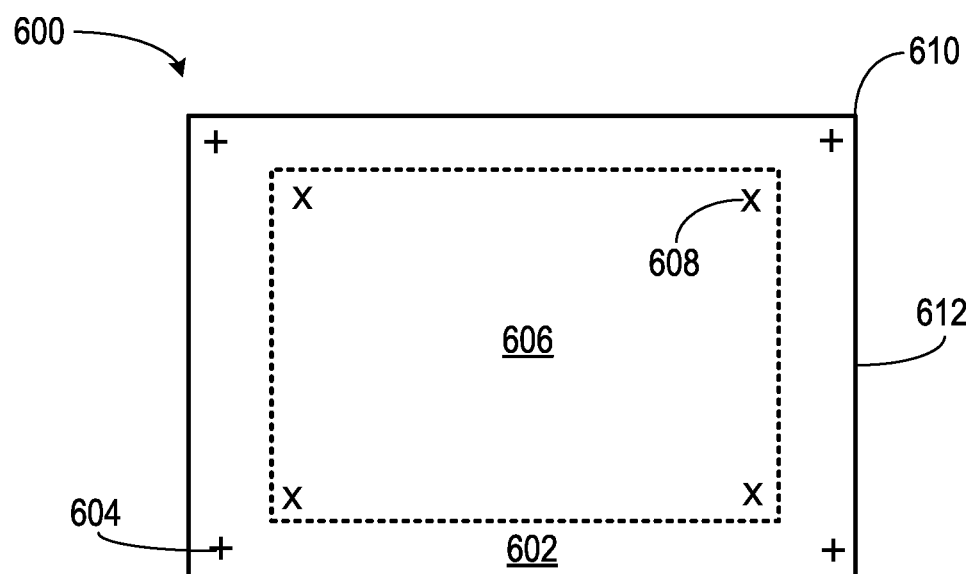
FIG. 6 depicts top view of an imprint lithography substrate (or a field of an imprint lithography substrate) having a central region and a peripheral region in the X-Y plane of the substrate.

Corresponding alignment marks of a complementary substrate are positioned in each imprint field of a substrate, with substrate peripheral alignment marks positioned proximate a corner or a boundary of the template imprinting area. FIG. 6 depicts an imprint field 600 of a substrate. Imprint field 600 has peripheral region 602 with peripheral alignment marks 604 and central region 606 with central alignment marks 608. Each peripheral alignment mark 604 of the substrate corresponds to one of peripheral alignment marks 504 of template 500, and each central alignment mark 608 corresponds to one of the central alignment marks 508 of the template. Peripheral alignment marks 604 may be proximate corners 610 or edges 612 of substrate 600.

As depicted, peripheral regions 502 and 602 form a continuous border proximate edges 512 of template 500 and edges 612 of imprint field 600. The border may have a constant width or a variable width. In one example, a width of the border at the corners of the template 500 or imprint field 600 exceeds a width of the border along straight edges of the template or the imprint field. In some cases, peripheral regions 502 and 602 include multiple discontinuous regions, with each discontinuous region including a corner of the template or substrate, respectively.

Figure 7:
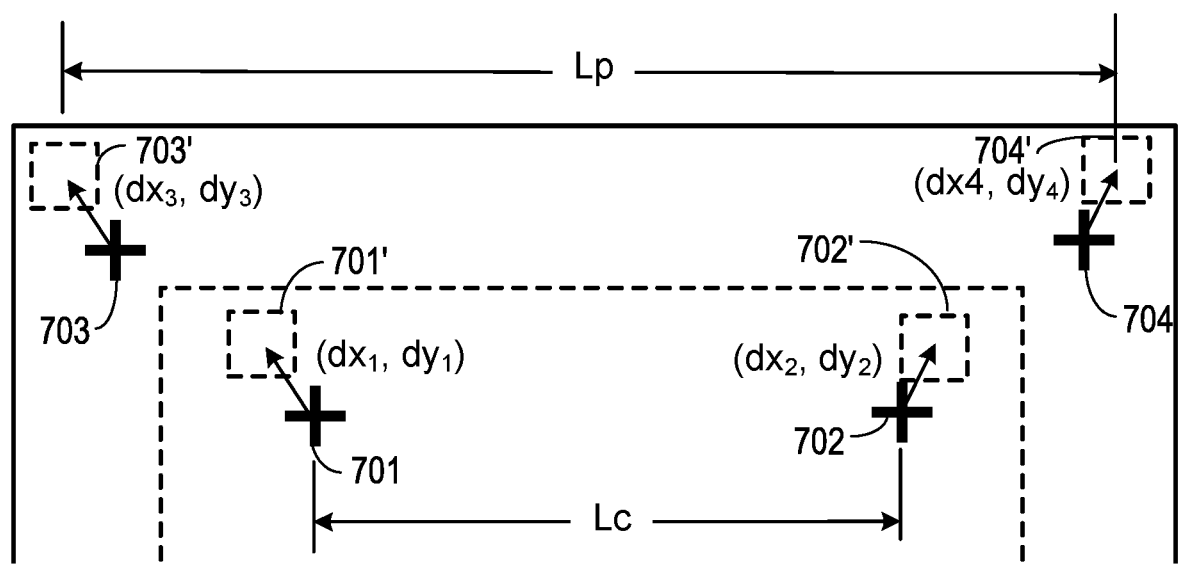
FIG. 7 depicts top views of an imprint lithography template superimposed on an imprint lithography substrate, showing alignment errors of pairs of corresponding central and peripheral alignment marks.

An in-plane alignment error of the template is assessed based on the relative positions of each central alignment mark of the template and each corresponding central alignment mark of the substrate when the template is superimposed over the substrate. FIG. 7 depicts a top view of a portion of a template in superimposition with a portion of a substrate. Central alignment marks 701, 701' and 702, 702' and peripheral alignment marks 703, 703' and 704, 704' are visible through the template. Alignment errors between pairs of corresponding central alignment marks and pairs of corresponding peripheral alignment marks in the X-Y plane of the template are represented as $(dx_n, dy_n)$ for the nth pair of corresponding alignment marks. Vectors 705 indicate the direction and magnitude of the alignment errors. The distance between inner central marks 701, 702 of is depicted as Lc in the direction of the X-axis. Lc may be measured based on the template or the substrate.

From the measured alignment errors at the corresponding pairs of central alignment marks, in-plane alignment errors, including translation x and y along the X and Y axes, respectively, rotation θ in the X-Y plane about the Z axis, and magnification along the X axis can be calculated as shown in Equations (1)-(3).

$$(\Delta x, \Delta y) = [(dx_1 + dx_2)/2, (dy_1 + dy_2)/2] \quad (1)$$

$$\Delta\theta = (dy_1 - dy_2)/Lc \quad (2)$$

$$\Delta mag = (dx_1 - dx_2)/Lc \quad (3)$$

In a similar process, a combined alignment error (in-plane alignment error and out-of-plane alignment error) is assessed based on the relative positions of each peripheral alignment mark of the template and each corresponding peripheral alignment mark of the substrate. The central region of the template is typically free of out-of-plane alignment error. As such, an out-of-plane alignment error can be assessed by linearly removing the in-plane deformation from the combined alignment error. As depicted in FIG. 7, Lp is the distance between outer peripheral marks 703', 704' in the direction of the X-axis in the plane of the template, and h/2 is the distance from the center of the field to the peripheral marks in the Y direction. Out-of-plane alignment errors, $(dx_{3o}, dy_{3o})$, and $(dx_{4o}, dy_{4o})$, may be calculated as shown in Equations (4) and (5).

$$(dx_{3o}, dy_{3o}) = (dx_3, dy_3) - [(\Delta x, \Delta y) - \Delta\theta(h, Lp)/2] \quad (4)$$

$$(dx_{4o}, dy_{4o}) = (dx_4, dy_4) - [(\Delta x, \Delta y) - \Delta\theta(h, Lp)/2] \quad (5)$$

After subtraction of the in-plane alignment error $(dx_3, dy_3)$ and $(dx_4, dy_4)$, most or all of peripheral alignment error $(dx_{3o}, dy_{3o})$ and $(dx_{4o}, dy_{4o})$, respectively, may be attributed to out-of-plane alignment error or deformation of the template.

A relative position of the template and the substrate may be adjusted to reduce the in-plane alignment error, the out-of-plane alignment error, or both. In one example, a relative position of the template and the substrate is adjusted in a first adjustment or series of adjustments to reduce the in-plane alignment error, and a relative position of the template and the substrate is adjusted in a second adjustment or series of adjustments to reduce the out-of-plane alignment error. In another example, a relative position of the template and the substrate is adjusted in a first adjustment or series of adjustments to reduce the out-of-plane alignment error, and a relative position of the template and the substrate is adjusted in a second adjustment or series of adjustments to reduce the in-plane alignment error. Thus, alignment data from the central region and the peripheral region can be used as feedback signals to independently correct in-plane and out-of-plane alignment errors.

Figure 8A:
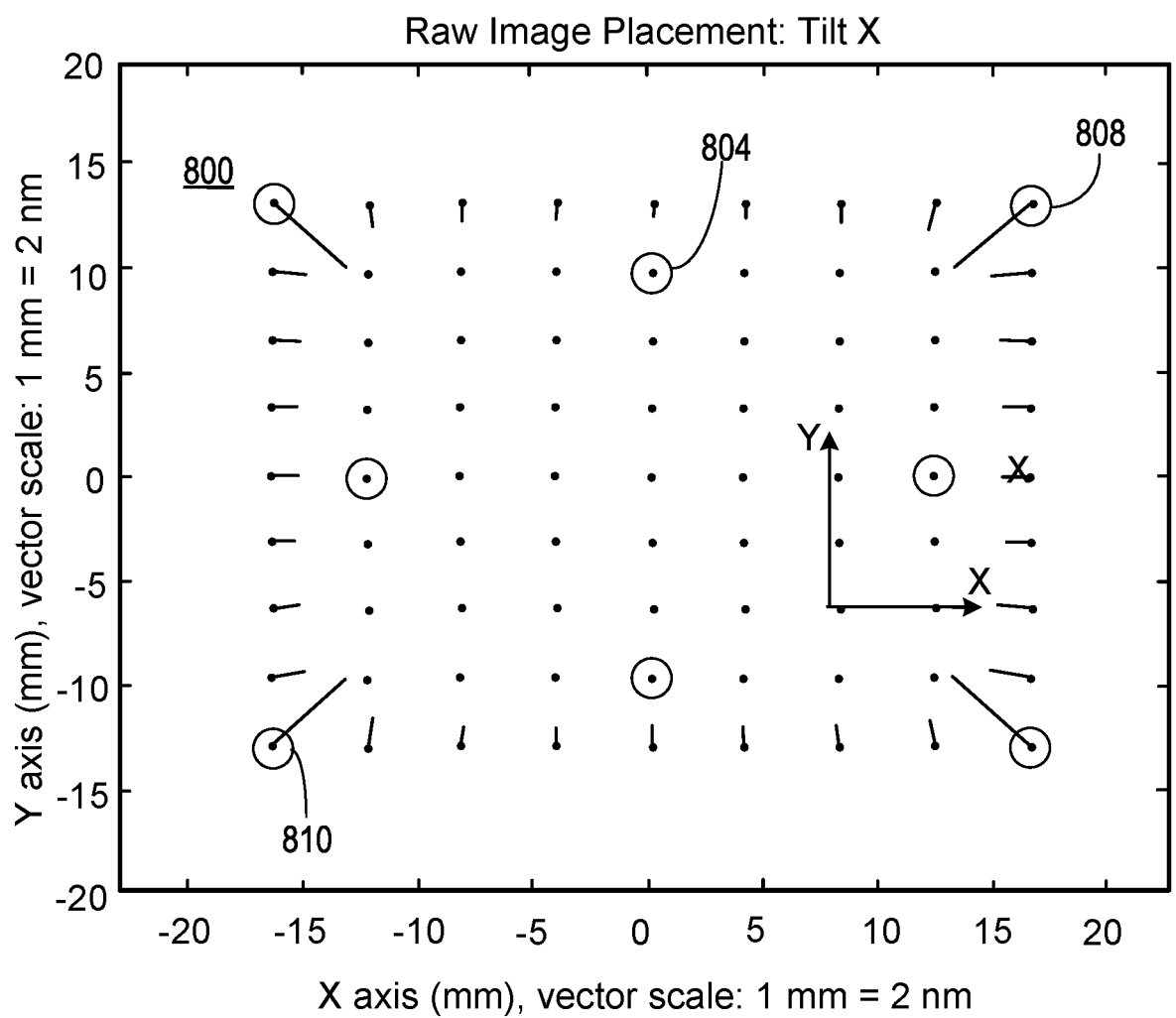
FIGS. 8A-8C depict nanoimprint lithography templates showing deformation due to force and tilt error.
Figure 8B:
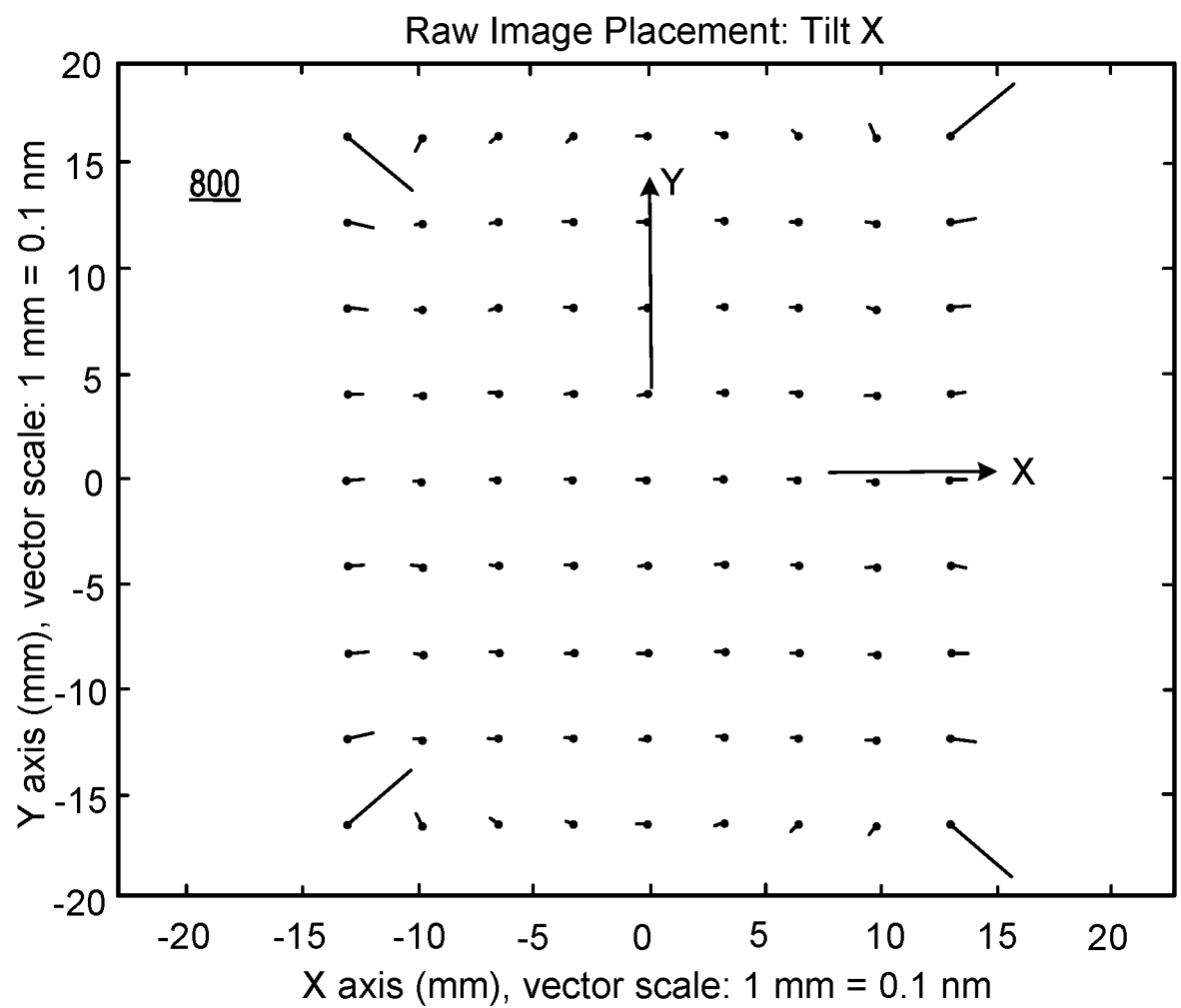
Figure 8C:
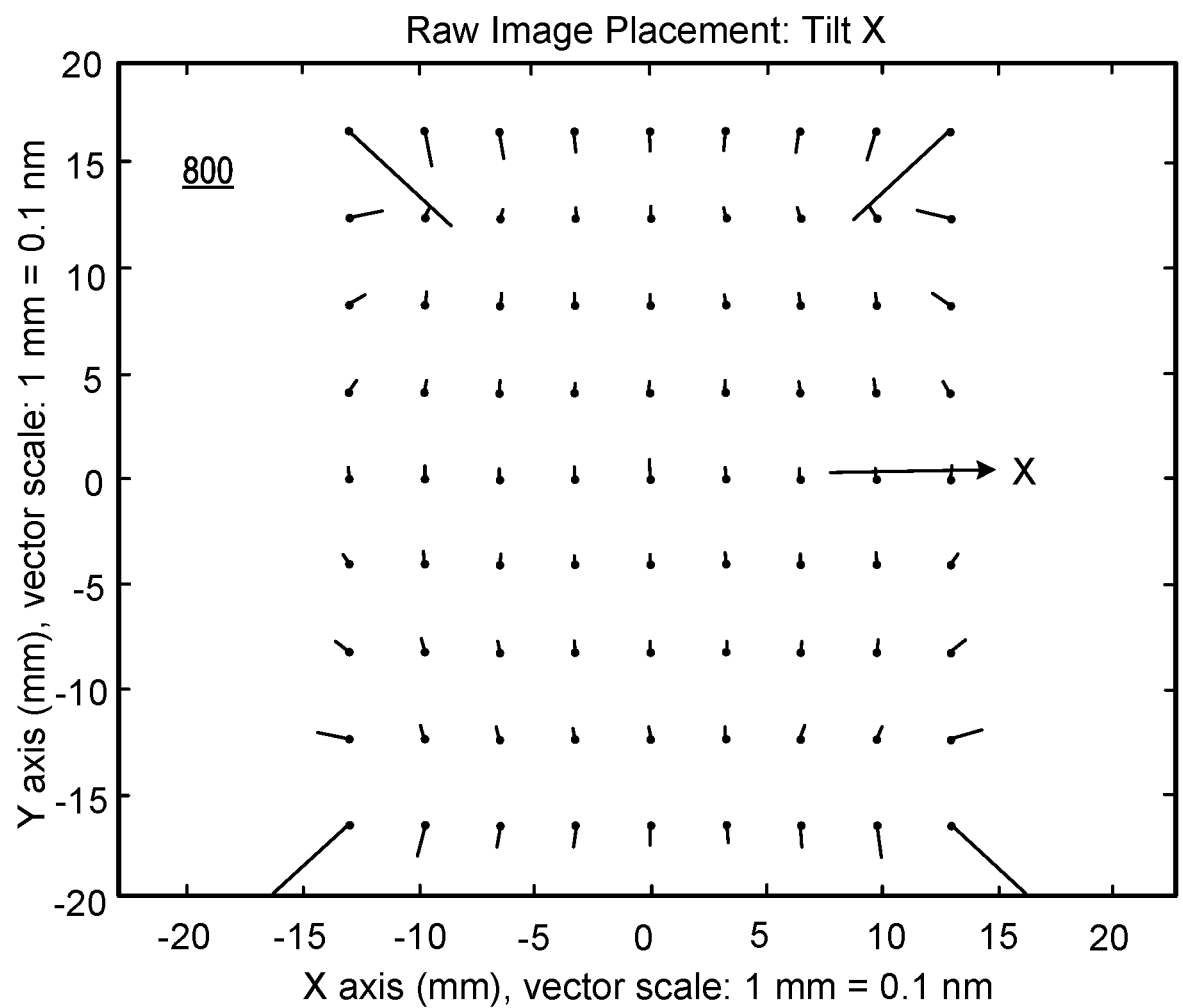

FIGS. 8A-8C depict deformations of nanoimprint lithography templates caused by imprint force, air cavity, and tilt errors estimated from simulation models (e.g., finite element analysis). These distortions are present in the imprinted substrates unless compensated for during the imprinting process.

FIG. 8A depicts deformation of nanoimprint lithography template 800 with central alignment marks 804 and peripheral alignment marks 808 due to a 1 N imprint force. Here, the template is made of 1.1 mm thick fused silica and has a field size of 26 mm by 33 mm. The 64 mm circular and 1.1 mm thick portion of the template is surrounded by ~6 mm thick semiconductor standard mask glass. The X-Y plane of template 800 is indicated, and the Z direction is orthogonal to the X-Y plane. Vectors 810 indicate a direction and magnitude of the deformation caused by the 1 N imprint force. As seen by the length of vectors 810, there is more deformation at peripheral alignment marks 808 than central alignment marks 804. FIG. 8B depicts deformation of nanoimprint lithography template 800 due to 1 μrad tilt (rotation) around the Y axis in the plane of the template. FIG. 8C depicts deformation of nanoimprint lithography template 800 due to 1 μrad tilt around the X axis in the plane of the template.

Adjusting the relative position of the template and the substrate to reduce the in-plane alignment error includes adjusting relative positions of the central alignment marks of the template and the corresponding central alignment marks of the substrate. The in-plane alignment error may be reduced first by assessing the magnitude and direction of alignment errors in x and y at each corresponding pair of alignment marks. Second, these measurements can be translated into placement error, rotation error, magnification error, skew error, and trapezoidal or higher order distortion of the template. Third, the substrate stage and the magnification actuator can generate corrective motions or forces. A corresponding in-plane translation, in-plane rotation, in-plane magnification or other in-plane force adjustment, or a combination thereof may be calculated to bring each corresponding pair of central alignment marks into an acceptable relative position (e.g., a predetermined bias) to compensate for the assessed alignment error, thereby reducing an overall alignment of the central alignment marks. Typical control resolution for these correction functions is less than 1 nm for the position control. Thus, assessed alignment error can be used as a feedback signal for relative in-plane movement of the template and the substrate to reduce in-plane alignment error.

Adjusting the relative position of the template and the substrate to reduce the out-of-plane alignment error includes adjusting relative positions of the peripheral alignment marks of the template and the corresponding peripheral alignment marks of the substrate to reduce an overall alignment error of the peripheral alignment marks. The out-of-plane alignment error may be reduced by assessing the magnitude and direction of the tilt error in the X-Y plane and the force error orthogonal to the X-Y plane, and then calculating a corresponding tilt direction and angle, distance between the template and the substrate, or combination thereof to bring each corresponding pair of peripheral alignment marks into an acceptable relative position (e.g., a predetermined bias), thereby reducing an overall deformation of the peripheral alignment marks. Typical control resolution for these correction functions is less than 1 nm for the position control and less than 0.05 N for the force control. Thus, in-plane metrology (that is, the relative displacement of the template in the X-Y plane) at the peripheral alignment marks may be used as a feedback signal to control the force error in the Z direction and the tilt of the X-Y plane of the template with respect to the X-Y plane of the substrate.

In one embodiment, the magnification error in the X-Y plane is independently calculated from the peripheral alignment marks and the central alignment marks, and at least one of the tilt angle of the template and the distance between the template is adjusted until the magnification error of the peripheral alignment marks and the magnification error of the central alignment marks are substantially the same. When the magnification error of the peripheral alignment marks and the magnification error of the central alignment marks are substantially the same, the out-of-plane alignment error has been effectively removed.

FIG. 9 depicts an alignment system 900 for adjusting a relative position of a template and a substrate based on assessed in-plane and out-of-plane deformations. In one embodiment, the alignment system 900 includes an optical system 902 for measurement of alignment error, error translator system 904, controller system 906, and actuator system

908. Error translator system 904 converts alignment error measurements into control parameters for an imprint lithography system, such as that depicted in FIG. 1. Typically, the conversion is based on geometric aspects of the template and the substrate. Optical system 902 includes peripheral "through the mask" (TTM) system 910 for assessing peripheral alignment error and central TTM system 912 for assessing central alignment error. Error translator system 904 includes in-plane translator 914 for in-plane alignment corrections and out-of-plane translator 916 for out of plane alignment corrections. Controller system 906 includes stage controller 918, in-plane magnification controller 920, and imprint head controller 922. Actuator system 908 includes stage 924, magnification unit 926, and imprint head 928. Stage controller 918 controls X-Y translation or rotation in the X-Y plane of the template or the substrate via stage 924 of actuator system 908. In-plane magnification controller 920 controls compression force on the template in the X-Y plane of the template via magnification unit 926 of actuator system 908. Imprint head 928 controls out-of-plane motion of the template, including the distance between the template and the substrate and the tilt of the template with respect to the substrate. Based on alignment errors assessed by optical system 902, and conversion of assessed alignment error to corrective positions or movements of the template and/or substrate by error translator system 902, controller system 906 provides signals to actuator system 908 to adjust the relative positioning of the template and substrate. Correction of in-plane alignment error includes translation of the template about orthogonal axes (X, Y) in the plane of the template, rotation (θ) of the template about an axis orthogonal to the plane, or both. Correction of out-of-plane alignment error includes translation of the template along the Z axis and rotation of the template about an axis in the plane of the template.

Alignment errors measured at peripheral alignment marks correspond linearly to the corrections in force and tilt. Therefore, corrections for out-of-plane alignment errors can be made without considering contributions from other mechanical sources or electric noises. This type of endpoint sensing effectively captures error sources with little or no delay, including magnification non-linearity, and reduces the need for force sensors and elaborate calibration requirements for the imprint head. Methods described herein can also be used to inform resist drop location and volume optimization to reduce residual layer thickness nonuniformity related to out-of-plane deformation of the template.

As described herein, a template with eight alignment marks (four central, four peripheral) may be used with an imprint lithography system having eight optical sensors for locating corresponding pairs of alignment marks. More generally, with an increased number of optical sensors, it is possible to increase the number of alignment marks so that a large number of alignment marks can be tracked in real time. For example, higher order overlay terms that vary with imprint force can be used as a feedback signal to optimize a distance between the template and the substrate along the Z axis.

Figure 10:
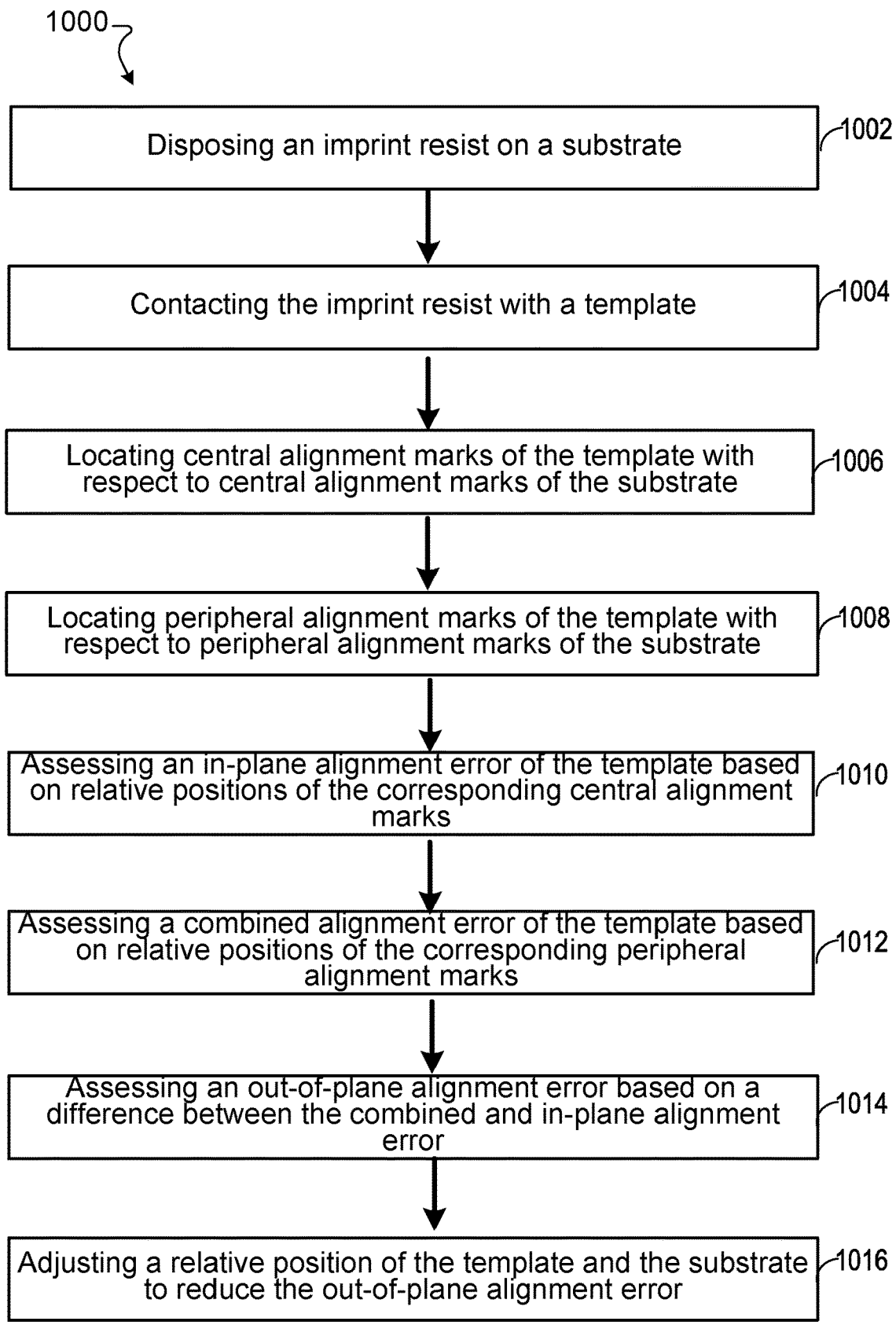
FIG. 10 is a flowchart for a process for reducing out-of-plane alignment error of an imprint lithography template.

FIG. 10 is a flowchart for operations in an imprint lithography process 1000 to reduce alignment errors of an imprint lithography template with respect to a substrate. Process 1000 is illustrated as a collection of referenced acts arranged in a logical flow graph. The order in which the acts are described is not intended to be construed as a limitation, and any number of the described acts can be combined in another order or in parallel to implement the process. In 1002, an imprint resist is disposed on a substrate (e.g., an imprint field of a substrate). In 1004, the imprint resist is contacted with a template. The template includes peripheral alignment marks in a peripheral region of a template and central alignment marks in a central region of the template. The substrate includes peripheral alignment marks that correspond to the peripheral alignment marks of the template and central alignment marks that correspond to the central alignment marks of the template. In 1006, each central alignment mark is located with respect to each corresponding central alignment mark of the substrate. In 1008, each peripheral alignment mark is located with respect to each corresponding peripheral alignment mark of the substrate. In 1010, an in-plane alignment error of the template is assessed based on relative positions of each central alignment mark of the template and each corresponding central alignment mark of the substrate. In 1012, a combined alignment error (in-plane and out-of-plane) is assessed based on relative positions of each peripheral alignment mark of the template and each corresponding peripheral alignment mark of the substrate. In 1014, an out-of-plane alignment error of the template is assessed based on a difference between the combined alignment error of the template and the in-plane alignment error of the template. In 1016, a relative position of the template and the substrate is adjusted to reduce the out-of-plane alignment error of the template.

An imprint lithography method of manufacturing an article includes operations 1002-1016 of process 1000, followed by polymerizing the imprint resist to yield a polymeric layer in contact with the template, and separating the template from the polymeric layer to yield the article. In some examples, the article is a processed substrate or an optical component.

A number of embodiments have been described. Nevertheless, it will be understood that various modifications may be made without departing from the spirit and scope of the disclosure. Accordingly, other embodiments are within the scope of the following claims.

What is claimed is:

1. An imprint lithography method for reducing an alignment error of an imprint lithography template with respect to a substrate, wherein the template comprises peripheral alignment marks in a peripheral region and central alignment marks in a central region thereof, the method comprising:
   a) disposing an imprint resist on the substrate, wherein the substrate comprises peripheral alignment marks corresponding to the peripheral alignment marks of the template and central alignment marks corresponding to the central alignment marks of the template before the imprint resist is disposed thereon;
   b) contacting the imprint resist with the template;
   c) locating each central alignment mark of the template with respect to each corresponding central alignment mark of the substrate;
   d) locating each peripheral alignment mark of the template with respect to each corresponding peripheral alignment mark of the substrate;
   e) assessing an in-plane alignment error of the template based on relative positions of each central alignment mark of the template and each corresponding central alignment mark of the substrate,
   f) assessing a combined alignment error of the template based on relative positions of each peripheral alignment mark of the template and each corresponding peripheral alignment mark of the substrate, wherein the combined alignment error of the template comprises the in-plane alignment error of the template and an out-of-plane alignment error of the template;

g) assessing the out-of-plane alignment error of the template based on a difference between the-combined alignment error of the template and the in-plane alignment error of the template; and h) adjusting a relative position of the template and the substrate to reduce the out-of-plane alignment error of the template.

2. The method of claim 1, wherein adjusting the relative position of the template and the substrate to reduce the out-of-plane alignment error of the template comprises adjusting relative positions of the peripheral alignment marks of the template and the corresponding peripheral alignment marks of the substrate.

3. The method of claim 2, wherein adjusting the relative positions of the peripheral alignment marks of the template and the corresponding peripheral alignment marks of the substrate comprises at least one of:

tilting the template relative to the substrate; and increasing or decreasing a distance between the template and the substrate, thereby increasing or decreasing a force exerted on the substrate by the template.

4. The method of claim 1, wherein adjusting the relative position of the template and the substrate to reduce the out-of-plane alignment error of the template comprises:

comparing a magnification error of the central region of the template based on the central alignment marks of the template and the corresponding central alignment marks of the substrate with a magnification error of the peripheral region of the template based on the peripheral alignment marks of the template and the corresponding peripheral alignment marks of the substrate; and tilting the template relative to the substrate or increasing or decreasing a distance between the template and the substrate until the magnification error of the peripheral region of the template is substantially equal to the magnification error of the central region of the template.

5. The method of claim 1, wherein adjusting the relative position of the template and the substrate to reduce the out-of-plane alignment error of the template comprises tilting the template relative to the substrate to compensate for a tilting of the substrate about an axis in the plane of the substrate due at least in part to force applied to the substrate with the template.

6. The method of claim 1, further comprising, after adjusting the relative position of the template and the substrate to reduce the out-of-plane alignment error of the template, repeating c) through h) to minimize the out-of-plane alignment error of the template.

7. The method of claim 1, further comprising adjusting the relative position of the template and the substrate to reduce the in-plane alignment error of the template.

8. The method of claim 1, wherein the central region of the template is substantially free of out-of-plane alignment error.

9. The method of claim 1, wherein adjusting the relative position of the template and the substrate to reduce the in-plane alignment error of the template comprises adjusting relative positions of the central alignment marks of the template and the corresponding central alignment marks of the substrate.

10. The method of claim 9, wherein adjusting the relative positions of the central alignment marks of the template and the corresponding central alignment marks of the substrate comprises at least one of: translating the template or the substrate in the plane of the template or the substrate, respectively; rotating the template or the substrate in the plane of the template or the substrate, respectively; and increasing or decreasing a compression force to opposite sides of the template.

11. An imprint lithography method of manufacturing an article, the method comprising:

a) disposing an imprint resist on a substrate, wherein the substrate comprises peripheral alignment marks in a peripheral region and central alignment marks in a central region thereof before the imprint resist is disposed thereon;

b) contacting the imprint resist with a template, wherein the template comprises peripheral alignment marks in a peripheral region of the template and central alignment marks in a central region of the template, and the peripheral alignment marks correspond to the peripheral alignment marks of the template and the central alignment marks correspond to the central alignment marks of the template;

c) locating each central alignment mark of the template with respect to each corresponding central alignment mark of the substrate;

d) locating each peripheral alignment mark of the template with respect to each corresponding peripheral alignment mark of the substrate;

e) assessing an in-plane alignment error of the template based on relative positions of each central alignment mark of the template and each corresponding central alignment mark of the substrate;

f) assessing a combined alignment error of the template based on relative positions of each peripheral alignment mark of the template and each corresponding peripheral alignment mark of the substrate, wherein the combined alignment error of the template comprises in-plane and out-of-plane alignment error of the template;

g) assessing an out-of-plane alignment error of the template based on a difference between the combined alignment error of the template and the in-plane alignment error of the template;

h) adjusting a relative position of the template and the substrate to reduce the out-of-plane alignment error of the template;

i) polymerizing the imprint resist to yield a polymeric layer in contact with the template; and j) separating the template from the polymeric layer to yield the article.

* * * * *